United States Patent
Li et al.

(10) Patent No.: US 10,291,179 B2
(45) Date of Patent: May 14, 2019

(54) OSCILLATOR AND CLOCK GENERATOR

(71) Applicant: TAIWAN SEMICONDUCTOR MANUFACTURING COMPANY LTD., Hsinchu (TW)

(72) Inventors: Chao-Chieh Li, Hsinchu (TW); Robert Bogdan Staszewski, Dublin (IE)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 15/385,213

(22) Filed: Dec. 20, 2016

(65) Prior Publication Data

US 2018/0152139 A1 May 31, 2018

Related U.S. Application Data (60) Provisional application No. 62/427,717, filed on Nov. 29, 2016.

(51) Int. Cl.
| | |
|---|---|
| *H03B 5/12* | (2006.01) |
| *H03K 3/03* | (2006.01) |
| *H03K 5/15* | (2006.01) |
| *H03K 5/151* | (2006.01) |

(52) U.S. Cl.
CPC ......... *H03B 5/1265* (2013.01); *H03B 5/1212* (2013.01); *H03B 5/1228* (2013.01); *H03B 5/1296* (2013.01); *H03K 3/0315* (2013.01); *H03K 5/15* (2013.01); *H03K 5/1515* (2013.01)

(58) Field of Classification Search
CPC .... H03B 5/1265; H03B 5/1212; H03B 5/121; H03B 5/1215; H03K 3/0315; H03K 3/0322; H03K 5/15; H03K 5/1515
USPC ......................................................... 327/295
See application file for complete search history.

(56) References Cited

U.S. PATENT DOCUMENTS

| | | | |
|---|---|---|---|
| 8,368,437 B2 | 2/2013 | Huang et al. | |
| 8,456,207 B1 | 6/2013 | Kuo et al. | |
| 8,547,151 B2 | 10/2013 | Kuo et al. | |
| 8,570,082 B1 | 10/2013 | Kuo et al. | |
| 8,593,189 B1 | 11/2013 | Yen et al. | |
| 8,890,626 B2 | 11/2014 | Chen et al. | |
| 9,065,454 B2 | 6/2015 | Lin | |
| 9,112,507 B2 | 8/2015 | Chen et al. | |
| 9,490,745 B1 * | 11/2016 | Toso | H03B 5/1212 |
| 2007/0182502 A1 * | 8/2007 | Shin | H03B 5/1228 |
| | | | 331/167 |
| 2013/0285722 A1 | 10/2013 | Chou | |
| 2015/0162921 A1 | 6/2015 | Chen | |
| 2015/0194971 A1 | 7/2015 | Tsai | |
| 2016/0056799 A1 * | 2/2016 | Ximenes | H03B 5/1265 |
| | | | 331/74 |

\* cited by examiner

*Primary Examiner* — Patrick C Chen
(74) *Attorney, Agent, or Firm* — Juan Carlos A. Marquez; Marquez IP Law Office, PLLC (57) ABSTRACT

An oscillator includes an oscillator circuit and a voltage circuit. The oscillator circuit includes a first transistor. The voltage circuit is configured to, in a small signal mode, provide a voltage swing at a source of the first transistor, a gate-to-source voltage of the first transistor being associated with whether the oscillator is able to generate an oscillator signal.

19 Claims, 11 Drawing Sheets

OSCILLATOR AND CLOCK GENERATOR

PRIORITY CLAIM AND CROSS-REFERENCE

This application claims the benefit of provisional application Ser. 62/427,717 filed on Nov. 29, 2016, entitled "OSCILLATOR AND CLOCK GENERATOR" the disclosure of which is hereby incorporated by reference in its entirety.

BACKGROUND

All-digital PLLs (ADPLL) are widely used in advanced CMOS where they exploit the naturally fine resolution of digitally-controlled oscillators (DCO). Compared with the analog PLL, the ADPLL is area efficient and has relatively low power dissipation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments or examples, for implementing different features of various embodiments. Specific examples of components and arrangements are described below to simplify the present disclosure. An inventive concept may, however, be embodied in many different forms and should not be construed as being limited to the embodiments set forth herein; rather, these embodiments are provided so that this description will be thorough and complete, and will fully convey an inventive concept to those of ordinary skill in the art. It will be apparent, however, that one or more embodiments may be practiced without these specific details. In addition, the present disclosure may repeat reference numerals and/or letters in the various examples. This repetition is for the purpose of simplicity and clarity and does not in itself dictate a relationship between the various embodiments and/or configurations discussed.

It will be understood that when an element or layer is referred to as being "on," "connected to" or "coupled to" another element or layer, it can be directly on, or connected or coupled to the other element or layer or intervening dements or layers may be present. In contrast, when an element is referred to as being "directly on," "directly connected to" or "directly coupled to" another element or layer, there are no intervening elements or layers present.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

Figure 1:
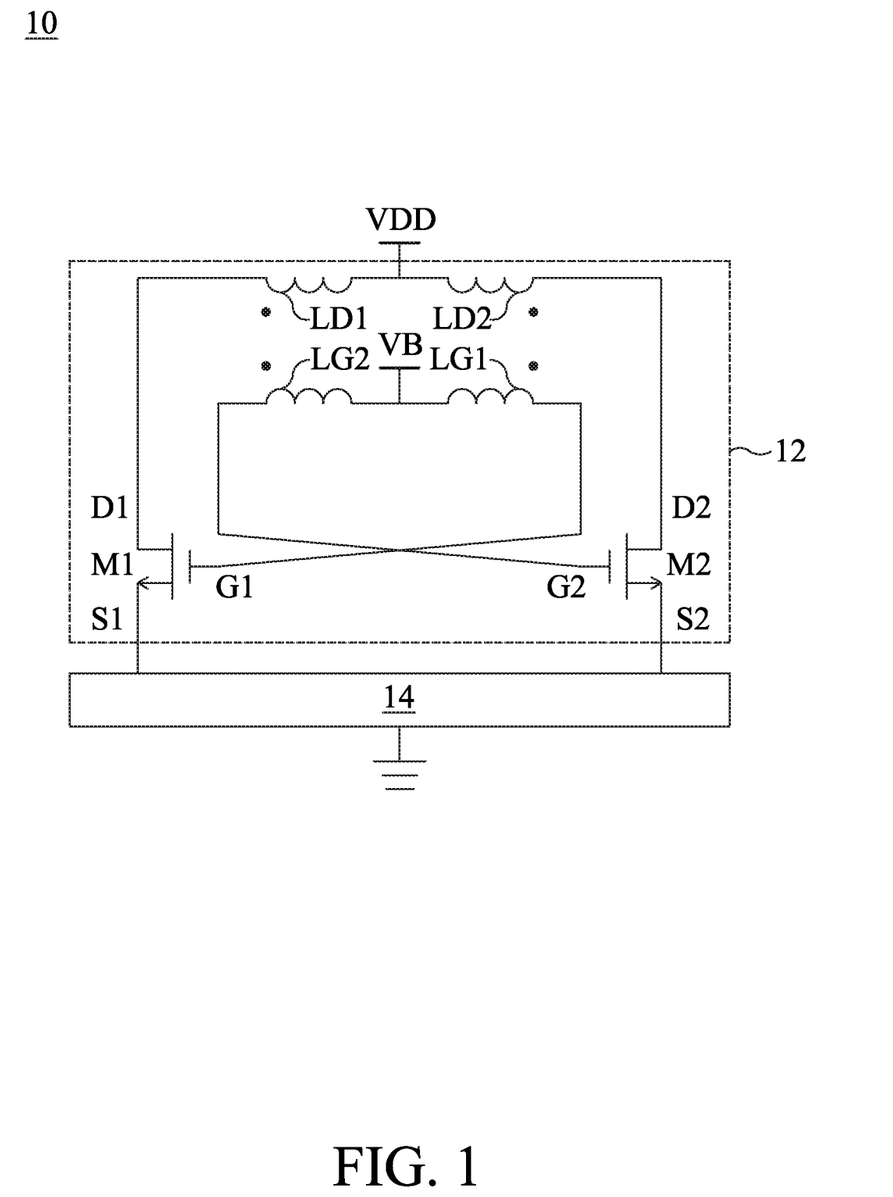
FIG. 1 is a circuit diagram of an oscillator, in accordance with some embodiments of the present disclosure.

FIG. 1 is a circuit diagram of an oscillator 10, in accordance with some embodiments of the present disclosure. Referring to FIG. 1, the oscillator 10 operates in a power domain defined by a supply voltage VDD and a reference voltage GND. The oscillator 10 includes an oscillator circuit 12 and a voltage circuit 14. The oscillator circuit 12 functions to generate an oscillator signal at a gate G1 of a first transistor M1 of the oscillator 10 and at a gate G2 of a second transistor M2 of the oscillator 10. The oscillator signal at the gate G1 is opposite to the oscillator signal at the gate G2 in voltage polarity. In the present embodiment, each of the first transistor M1 and the second transistor M2 includes a metal-oxide semiconductor (MOS) transistor. The first transistor M1 in the present embodiment includes an N-type metal-oxide semiconductor (NMOS) transistor. Also, the second transistor M2 in the present embodiment includes an N-type metal-oxide semiconductor (NMOS) transistor. In other embodiments, each of the first transistor M1 and the second transistor M2 includes a metal-oxide-semiconductor field-effect transistor (MOSFET).

The oscillator circuit 12 includes a transformer including a first inductor LG1 and a second inductor LD1. A mutual inductance exists between the first inductor LG1 and the second inductor LD1. The first inductor LG1 in polarity is opposite to the second inductor LD1. The first inductor LG1, coupled between a bias voltage VB and the gate of the first transistor M1, functions to, in a small signal mode, provide a voltage swing at the gate G1 of the first transistor M1. The second inductor LD1, coupled between a supply voltage VDD and a drain D1 of the first transistor M1, functions to, in a small signal mode, provide a voltage swing at a drain D1 of the first transistor M1. A turn ratio of the first inductor LG1 to the second inductor LD1 is N:1, wherein N is an integer larger than 1.

The voltage circuit 14, coupled between a source S1 of the first transistor M1 and the reference voltage GND, functions to, in a small signal mode, provide a voltage swing at the source S1 of the first transistor M1. A phase of the voltage swing provided by the voltage circuit 14 at the source S1 of the first transistor M1 is opposite to that at the gate G1 of the first transistor M1, which will be described in detail with reference to FIGS. 2 and 7.

As shown in FIG. 1, the oscillator 10, in circuit structure, is symmetric. As such, an inductor LG2 can be called a third inductor, and an inductor LD2 can be called a fourth inductor. Moreover, due to symmetric circuit structure, a voltage at the source S1 of the first transistor M1 is substantially opposite to that at the source S2 of the second transistor M2; a voltage at the drain D1 of the first transistor M1 is substantially opposite to that at a drain D2 of the second transistor M2; and a voltage at the gate G1 of the first transistor M1 is substantially opposite to that at the gate G2 of the second transistor M2. Additionally, due to symmetric circuit structure, an operation among the first inductor LG1, the second inductor LD1, the first transistor M1 and the voltage circuit 14 is substantially the same as another operation among the third inductor the fourth inductor LD2, the second transistor M2 and the voltage circuit 14. For the sake of simplicity, the other operation will be omitted herein.

In operation, a gate-to-source voltage (Vgs), in a small signal mode, of the first transistor M1 may determine whether the oscillator 10 is able to generate an oscillator signal. Specifically, a relatively high gate-to-source voltage of the first transistor M1 facilitates the oscillator 10 to generate an oscillator signal. In the present disclosure, with the voltage circuit 14, the voltage, in a small signal mode, at the source S1 of the first transistor M1 is a voltage swing rather than zero. Therefore, it is easier to generate an oscillator signal.

In some existing approaches, a source of a transistor (such as the transistor M1 and the transistor M2) is directly coupled to a reference ground without other components therebetween. A voltage of the reference ground is substantially equal to zero. As a result, in a small signal mode, a voltage at the source of the transistor is substantially equal to zero, which may be disadvantageous to the generation of an oscillator signal.

Figure 2:
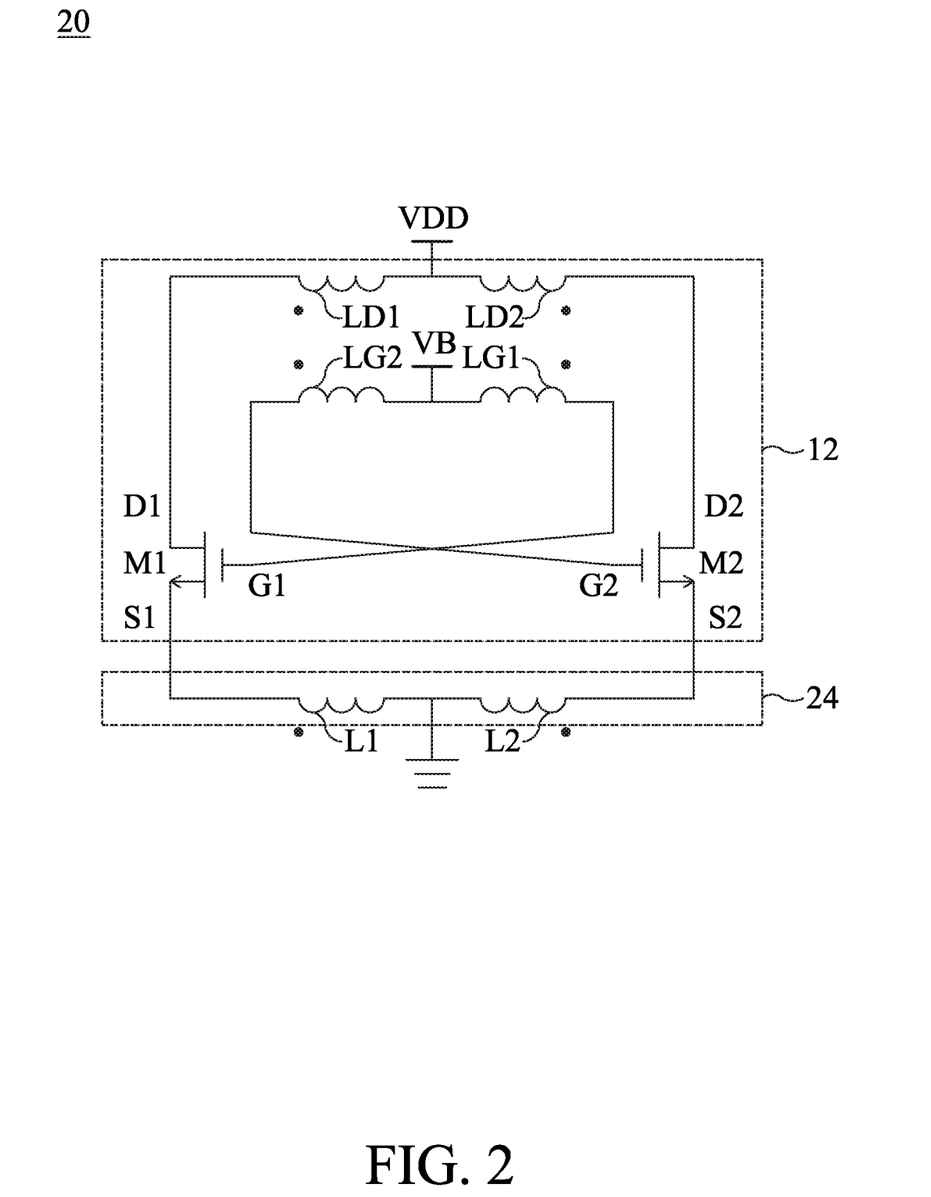
FIG. 2 is a circuit diagram of another oscillator, in accordance with some embodiments of the present disclosure.

FIG. 2 is a circuit diagram of an oscillator 20, in accordance with some embodiments of the present disclosure. Referring to FIG. 2, the oscillator 20 is similar to the oscillator 10 described and illustrated with reference to FIG. 1 except that, for example, the oscillator 20 includes a first inductive device 24. The first inductive device 24 functions to provide a voltage swing at the source S1 of the first transistor M1. A mutual inductance exists between the first inductor LG1 and the first inductive device 24, and the first inductor LG1 in polarity is opposite to the first inductive device 24. Accordingly, a phase of the voltage swing provided by the first inductive device 24 at the source S1 of the first transistor M1 is opposite to that at the gate G1 of the first transistor M1. As a result, the gate-to-source voltage of the first transistor M1 is relatively high, and therefore facilitates the oscillator 20 to generate an oscillator signal.

In an embodiment, the first inductive device 24 includes a first additional inductor L1 coupled between the source S1 of the first transistor M1 and the reference ground GND, and a second additional inductor L2 coupled between the source S2 of the second transistor M2 and the reference ground GND. A mutual inductance exists between the first inductor LG1 and the first additional inductor L1, and the first inductor LG1 in polarity is opposite to the first additional inductor L1. Accordingly, a phase of the voltage swing provided by the first additional inductor L1 at the source S1 of the first transistor M1 is opposite to that at the gate G1 of the first transistor M1. As a result, the gate-to-source voltage of the first transistor M1 is relatively high, and therefore facilitates the oscillator 20 to generate an oscillator signal.

In operation, the oscillator 20, in a small signal mode, operates under a condition in which a gate-to-source voltage (Vgs) of the first transistor M1 is smaller than a threshold voltage Vth. Such condition is satisfied when the first transistor M1 operates in a sub-threshold region. In the sub-threshold region, less phase noise of the Vgs may occur.

Generally, a square waveform has relatively high immunity to noise in rising and falling edges of a Vgs of a transistor and prevents the oscillator signal from frequency modulation due to flicker noise and thermal noise, and therefore can alleviate phase noise. When an impedance seen from an inductive device (such as the first inductive device 24) at an odd harmonic frequency (such as the $1^{st}$ harmonic frequency, the $3^{rd}$ harmonic frequency, etc.) of the Vgs is higher than that at an even harmonic frequency (such as the $2^{nd}$ harmonic frequency, the $4^{th}$ harmonic frequency, etc.) of the Vgs, the waveform of the Vgs behaves as a square-like waveform.

In the present disclosure, a turn ratio of the first additional inductor L1 to the first inductor LG1 is associated with a waveform of a gate-to-source voltage (Vgs) of the first transistor M1. Alternatively, the turn ratio is associated with impedance at the $3^{rd}$ harmonic frequency of the source voltage Vs of the first transistor M1. When a first turn ratio of the first additional inductor L1 to the first inductor LG1 satisfies 4N:1, wherein N is a positive integer, the magnitude of impedance seen from the first inductive device 24 (associated with the source S1 of the first transistor M1) at the $3^{rd}$ harmonic frequency of the source voltage Vs (the voltage swing at the source S1) of the first transistor M1 is relatively high. Therefore, a waveform of the Vgs behaves as a square-like waveform, which is shown in FIG. 7(d). As a result, phase noise can be alleviated.

Figure 3:
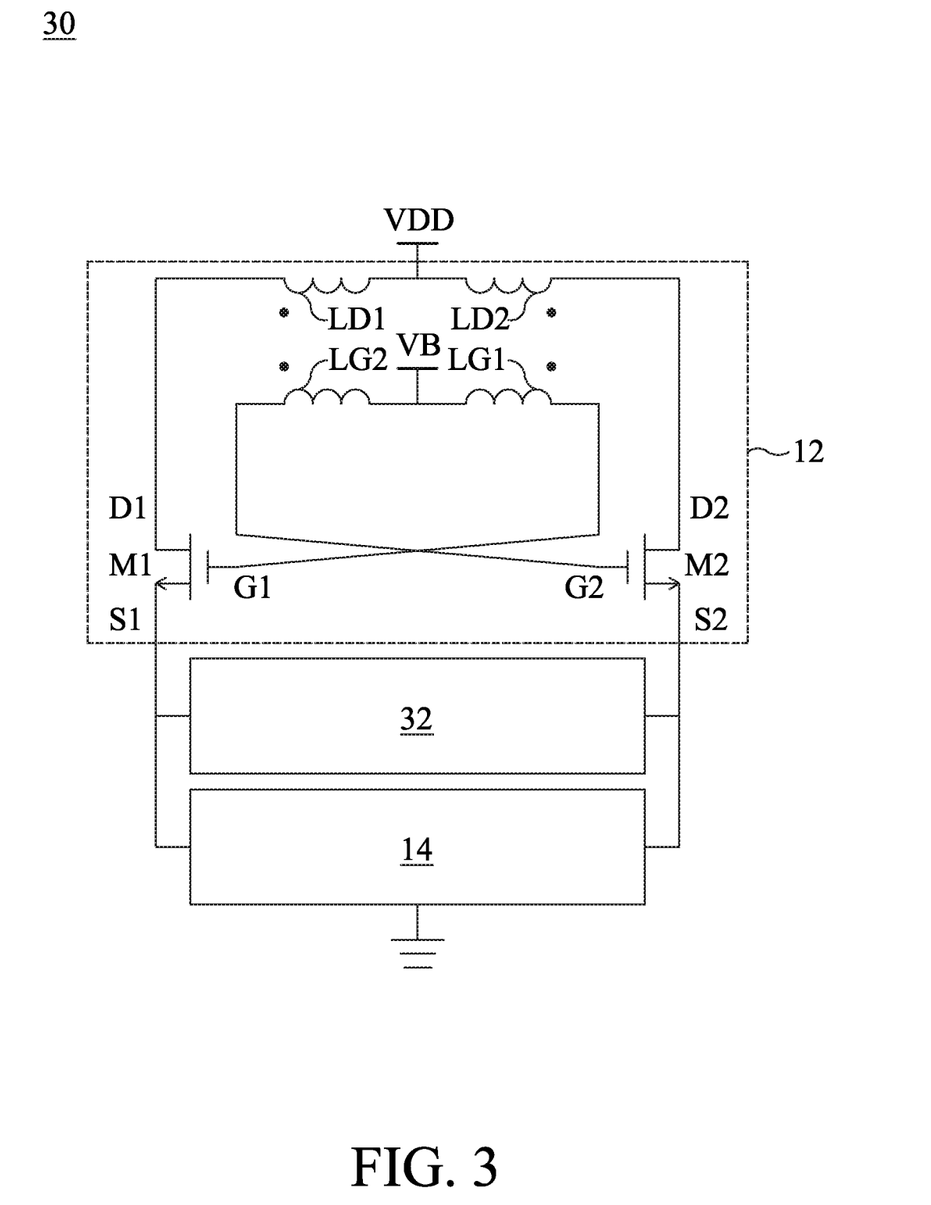
FIG. 3 is a circuit diagram of still another oscillator, in accordance with some embodiments of the present disclosure.

FIG. 3 is a circuit diagram of an oscillator 30, in accordance with some embodiments of the present disclosure. Referring to FIG. 3, the oscillator 30 is similar to the oscillator 10 described and illustrated with reference to FIG. 1 except that, for example, the oscillator 30 further includes a frequency adjustment circuit 32.

The frequency adjustment circuit 32, coupled between the source S1 of the first transistor M1 and the source S2 of the second transistor M2, functions to, in response to a control signal, adjust a capacitance associated with the source S1 of the first transistor M1 from a first capacitance to a second capacitance. The capacitance associated with the source S1 of the first transistor. M1 affects a frequency of an oscillator signal generated by the oscillator 30, which will be described in detail with reference to FIG. 4.

With the voltage circuit 14 and the frequency adjustment circuit 32, not only it is relatively easier to generate an oscillator signal, but also it is able to adjust the frequency of the oscillator signal.

Figure 4:
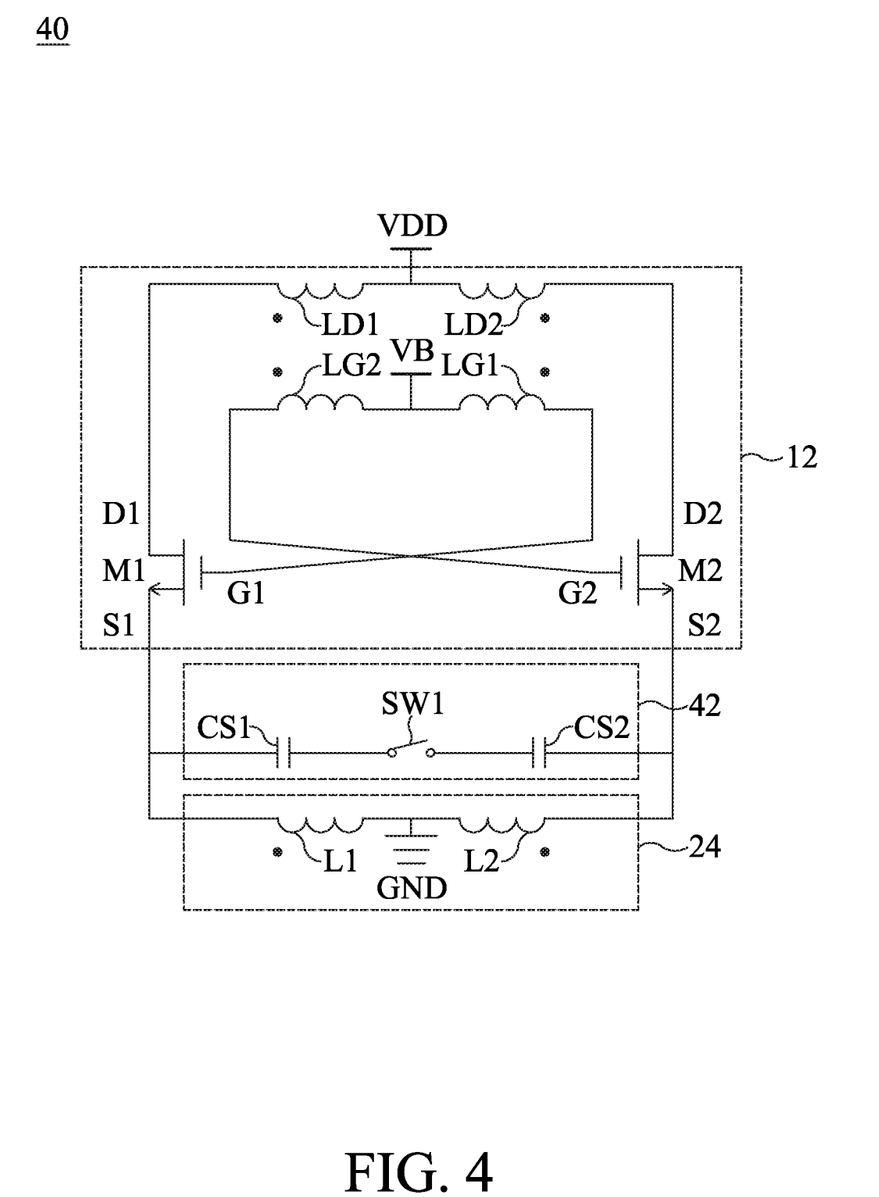
FIG. 4 is a circuit diagram of yet another oscillator, in accordance with some embodiments of the present disclosure.

FIG. 4 is a circuit diagram of an oscillator 40, in accordance with some embodiments of the present disclosure. Referring to FIG. 4, the oscillator 40 is similar to the oscillator 20 described and illustrated with reference to FIG. 2 except that, for example, the oscillator 40 further includes a frequency adjustment circuit 42. The frequency adjustment circuit 42 is similar to the frequency adjustment circuit 32 described and illustrated with reference to FIG. 3 except that, for example, the frequency adjustment circuit 42 includes a first capacitor CS1, a second capacitor CS2 and a first switch SW1 connected in series with each other. The serially-connected first capacitor CS1, second capacitor CS2 and first switch SW1 are coupled between the source S1 of the first transistor M1 and the source S2 of the second transistor M2.

The first switch SW1 is controlled by the control signal. In operation, when the first switch SW1 is conducted, due to the symmetric circuit structure, a tap between the first capacitor CS1 and the second capacitor CS2 can be deemed as the reference ground GND. As such, the first capacitor CS1 is coupled between the source S1 of the first transistor M1 and the reference ground GND. Accordingly, when the first switch SW1 is conducted, the capacitance associated with the source S1 of the first transistor M1 is referred to as a first capacitance, which includes a capacitance of the first capacitor CS1. Since it takes time to charge or discharge the first capacitor CS1, in such scenario the frequency of the oscillator signal is relatively low. As a result, with the conducted first switch SW1 and the first capacitor CS1, the capacitance associated with the source S1 of the fires transistor M1 is relatively high. In contrast, when the first switch SW1 is not conducted, the capacitance associated with the source S1 of the first transistor M1 is not affected by the capacitance of the first capacitor CS1. Accordingly, when the first switch SW1 is not conducted, since there is no need to charge or discharge the first capacitor CS1, the frequency of the oscillator signal is relatively high. The frequency adjustment circuit 42 functions to adjust the frequency by a first scale ranging, for example, from 1 to 2 KHz, by way of adjusting the capacitance associated with the source S1 of the first transistor M1.

With the first inductive device 24 and the frequency adjustment circuit 42, not only it is relatively easier to generate an oscillator signal, but also it is able to adjust frequency of the oscillator signal.

Figure 5:
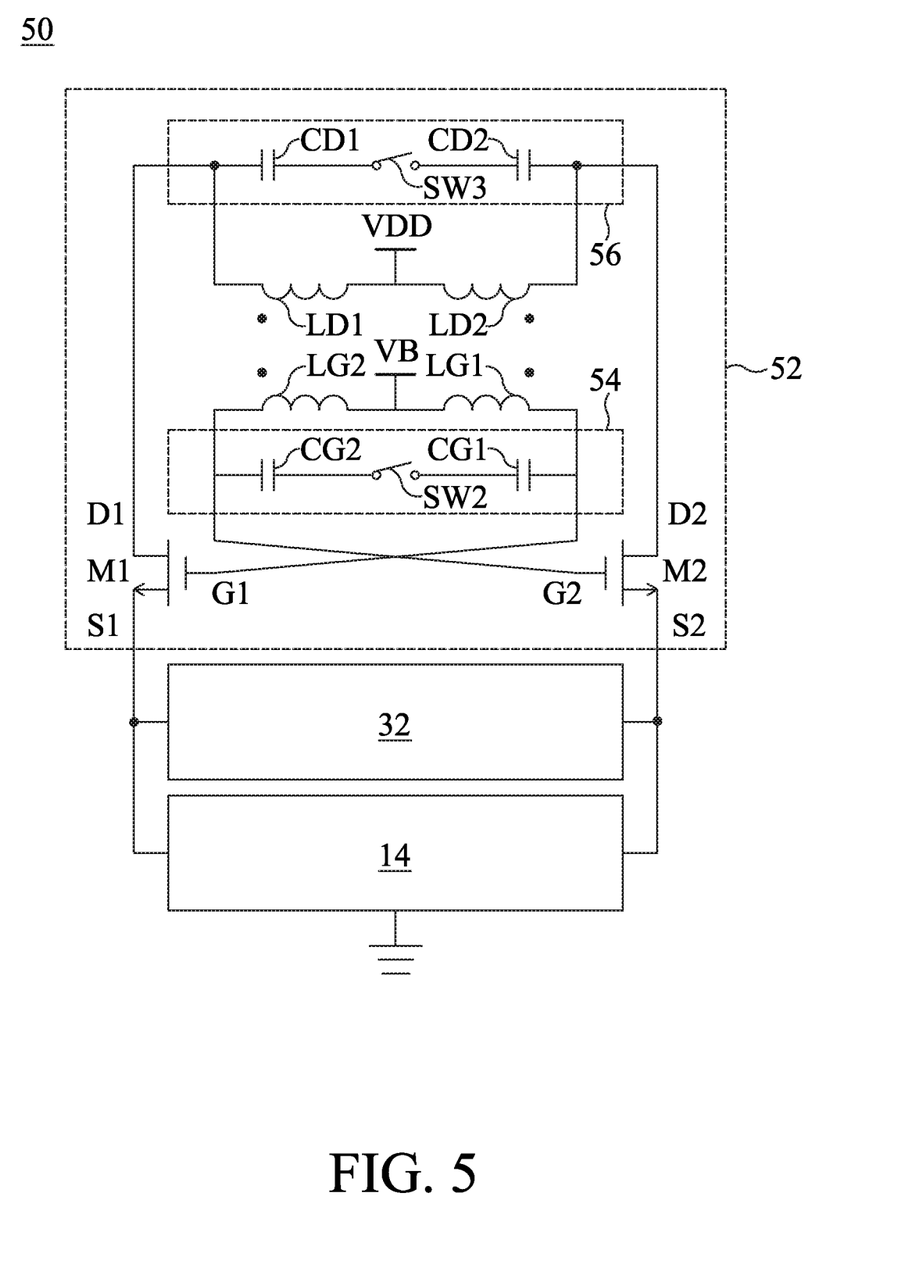
FIG. 5 is a circuit diagram of still yet another oscillator, in accordance with some embodiments of the present disclosure.

FIG. 5 is a circuit diagram of an oscillator 50, in accordance with some embodiments of the present disclosure. Referring to FIG. 5, the oscillator 50 is similar to the oscillator 30 described and illustrated with reference to FIG. 3 except that, for example, the oscillator 50 includes an oscillator circuit 52. The oscillator 52 is similar to the oscillator 12 described and illustrated with reference to FIG. 1, except that, for example, the oscillator 52 includes a first local circuit 54 and a second local circuit 56.

The first local circuit 54 includes a capacitor CG1, a capacitor CG2 and a switch SW2. The first local circuit 52 functions to adjust the frequency by a second scale ranging, for example, from 1 to 2 MHz, by way of adjusting a capacitance associated with the gate G1 of the first transistor M1. Connection and operation of those components in the first local circuit circuits 54 are similar to those in the frequency adjustment circuit 42 shown in FIG. 4. Therefore, the detailed operation is omitted herein. In contrast, as mentioned above, the frequency adjustment circuit 42 functions to adjust the frequency by the first scale. Since the second scale is larger than the first scale, the frequency of the oscillator signal is subject to a fine tune when adjusted by the first scale, while subject to a coarse tune when adjusted by the second scale. In this way, a fine tune on the frequency of the oscillator signal can be implemented.

The second local circuit 56 includes a capacitor CD1, a capacitor CD2 and a switch SW3. The second local circuit 56 functions to adjust the frequency by a third scale by way of adjusting a capacitance associated with the drain D1 of the first transistor M1. The third scale is larger than the first scale. In this way, a fine tune on the frequency of the oscillator signal can be implemented. In an embodiment, the third scale is different from the second scale. In another embodiment, the third scale is same as the second scale.

Figure 6:
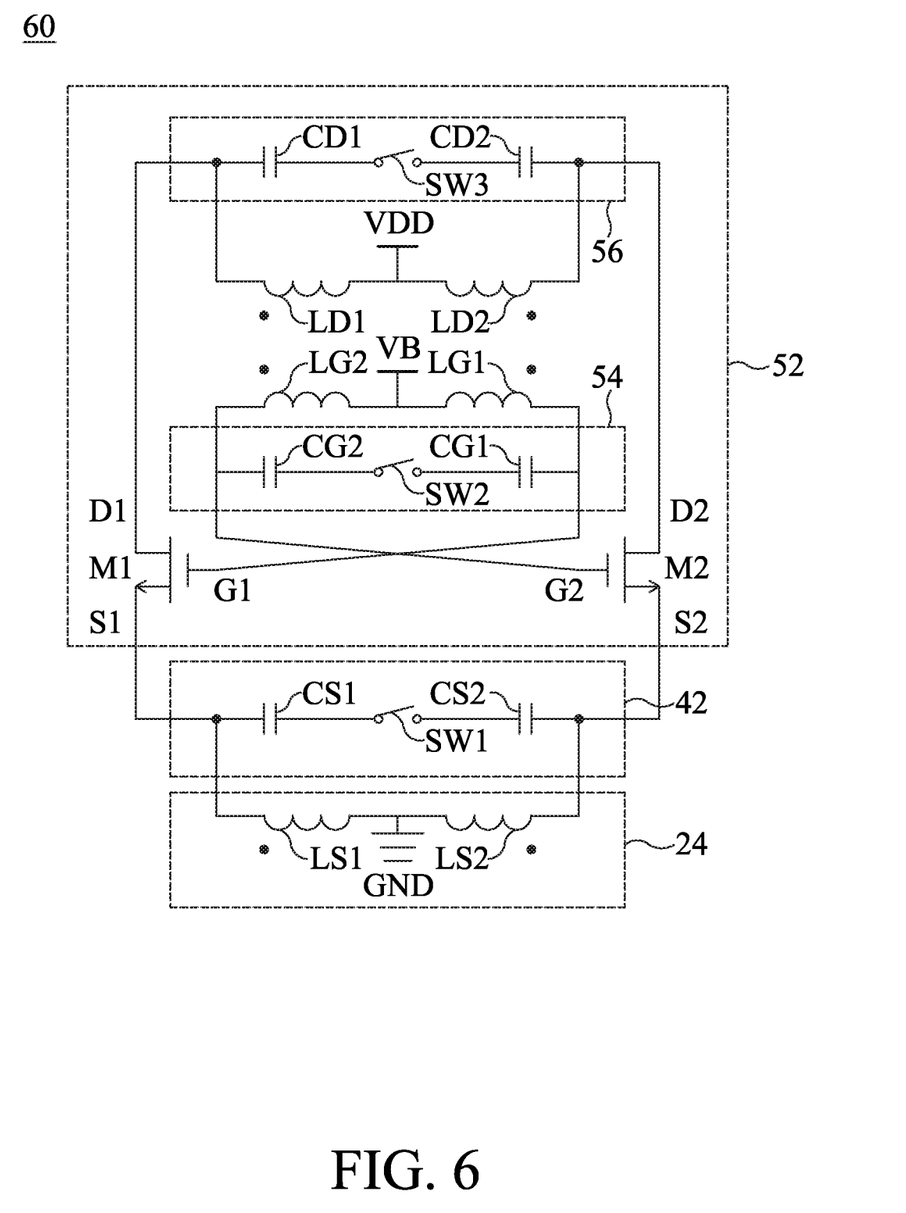
FIG. 6 is a circuit diagram of still yet further another oscillator, in accordance with some embodiments of the present disclosure.

FIG. 6 is a circuit diagram of an oscillator 60, in accordance with some embodiments of the present disclosure. Referring to FIG. 6, the oscillator 60 is similar to the oscillator 50 described and illustrated with reference to FIG. 5 except that, for example, the oscillator 60 includes the first inductive device 24 shown in FIG. 2 and the frequency adjustment circuit 42 shown in FIG. 4. For the similar reasons as mentioned above, with the first inductive device 24 and the frequency adjustment circuit 42, not only it is relatively easier to generate an oscillator signal, but also it is able to adjust frequency of the oscillator signal. Moreover, a fine tune on the frequency of the oscillator signal can be implemented.

FIGS. 7(a) to 7(d) illustrate waveforms associated with the first transistor M1 shown in FIG. 6, in accordance with some embodiments of the present disclosure. Comparing waveforms shown in FIGS. 7(a) and 7(b), since the turn ratio of the first inductor LG1 to the second inductor LD1 is N:1 (wherein N is positive integer and larger than 1), a peal-to-peak of a gate voltage Vg of the first transistor M1 is larger than that of a drain voltage Vd of the first transistor M1.

Figure 7A:
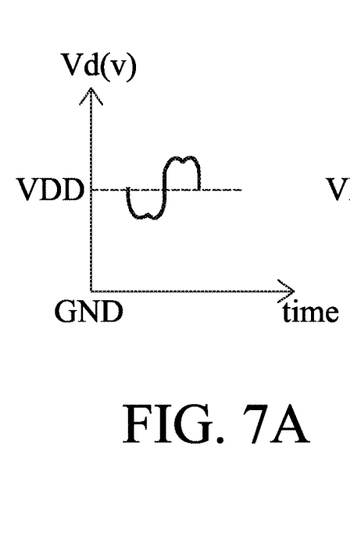
FIGS. 7(a) to 7(d) illustrate waveforms associated with the first transistor shown in FIG. 6, in accordance with some embodiments of the present disclosure.
Figure 7B:
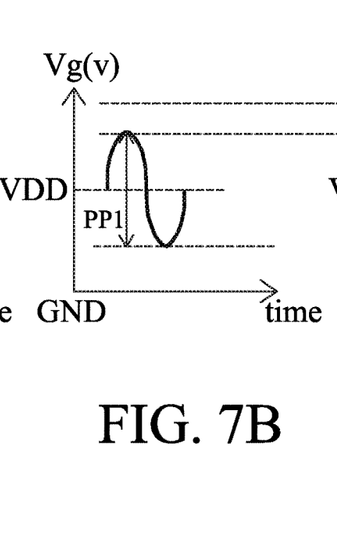
Figure 7C:
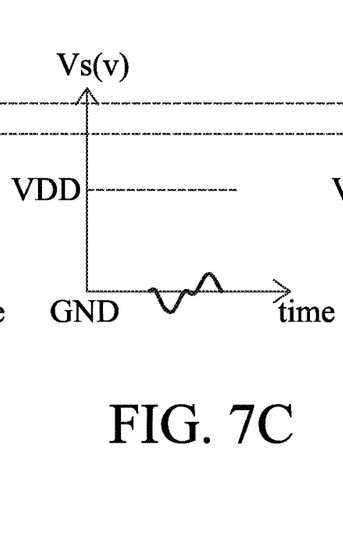
Figure 7D:
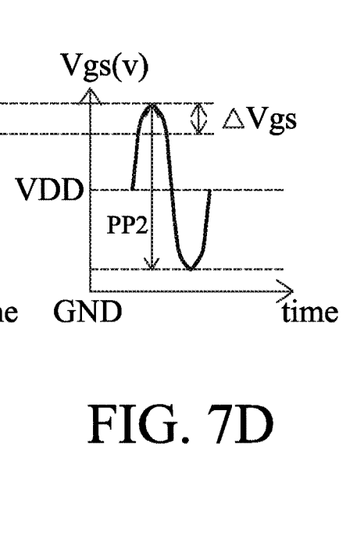

Referring to FIG. 7(c), with the voltage circuit 14 of the present disclosure, there is a voltage swing, in a small signal mode, on a source voltage Vs of the first transistor M1. Moreover, a direct-current (DC) level is about zero. Since the first inductor LG1 in polarity is opposite to the first inductive device 24, a phase of the source voltage Vs (the voltage swing) provided by the voltage circuit 14 is opposite to that of the gate voltage Vg of the first transistor M1. In this way, referring to FIG. 7(d), the gate-to-source voltage Vgs is relatively high.

In some existing oscillators, a source of a transistor (such as the transistor M1 and the transistor M2) is directly coupled to a reference ground, and therefore in a small signal mode, a voltage at the source of the transistor is substantially equal to zero. Accordingly, a gate-to-source voltage of the transistor is substantially equal to a voltage at the gate of the transistor, for example, referring to FIG. 7(b). Comparing FIGS. 7(d) and 7(b), there is a difference ΔVgs between a peak of Vgs and a peak of Vg. Therefore, for the existing oscillators, it is disadvantageous to the generation of an oscillator signal.

Figure 8:
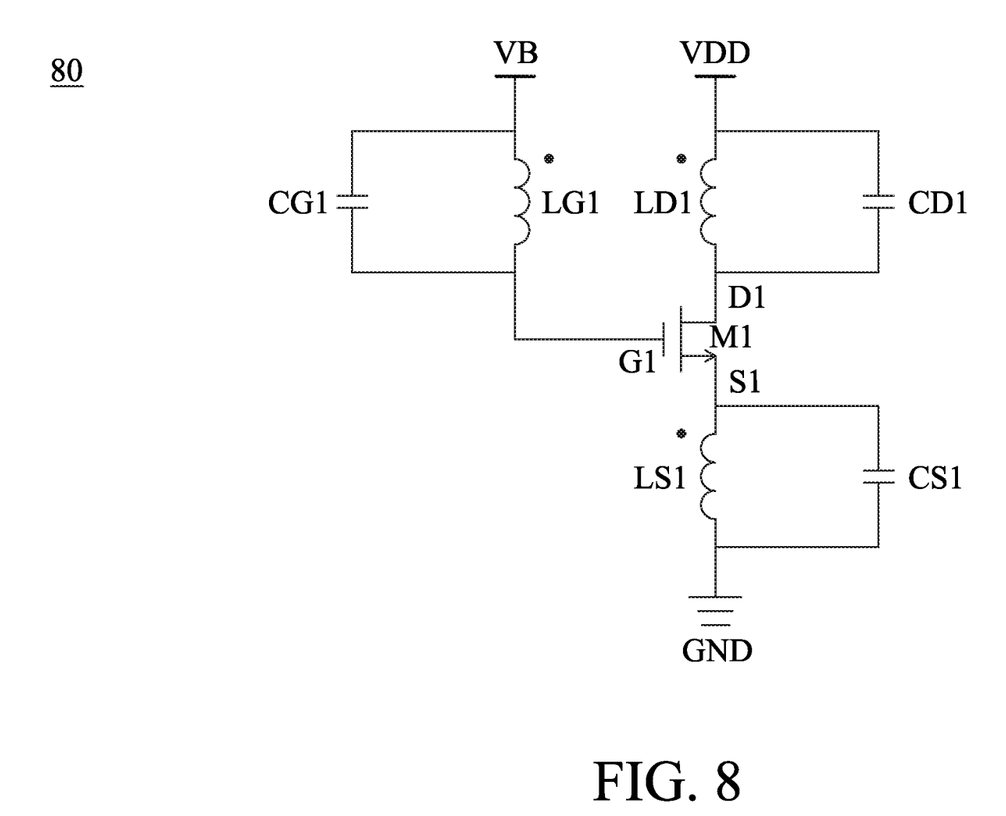
FIG. 8 is a circuit diagram of a half circuit of the oscillator shown in FIG. 6, in accordance with some embodiments of the present disclosure.

FIG. 8 is a circuit diagram of a half circuit of the oscillator 60 shown in FIG. 6, in accordance with some embodiments of the present disclosure. Referring to FIG. 8, when the switch SW3 is conducted, the capacitor CD1 can be deemed as being coupled between the drain D1 of the first transistor M1 and the reference ground GND. However, in a small signal mode, both the reference ground GND and the supply voltage VDD are deemed as the reference ground GND. That is, the reference ground GND is replaceable by the supply voltage VDD. Referring back to FIG. 8, for simplifying the circuit analysis, one end of the capacitor CD1 is coupled to the supply voltage VDD rather than the reference ground GND. For the similar reasons, one end of the capacitor CG1 is coupled to the bias voltage VB rather than the reference ground. GND.

Figure 9:
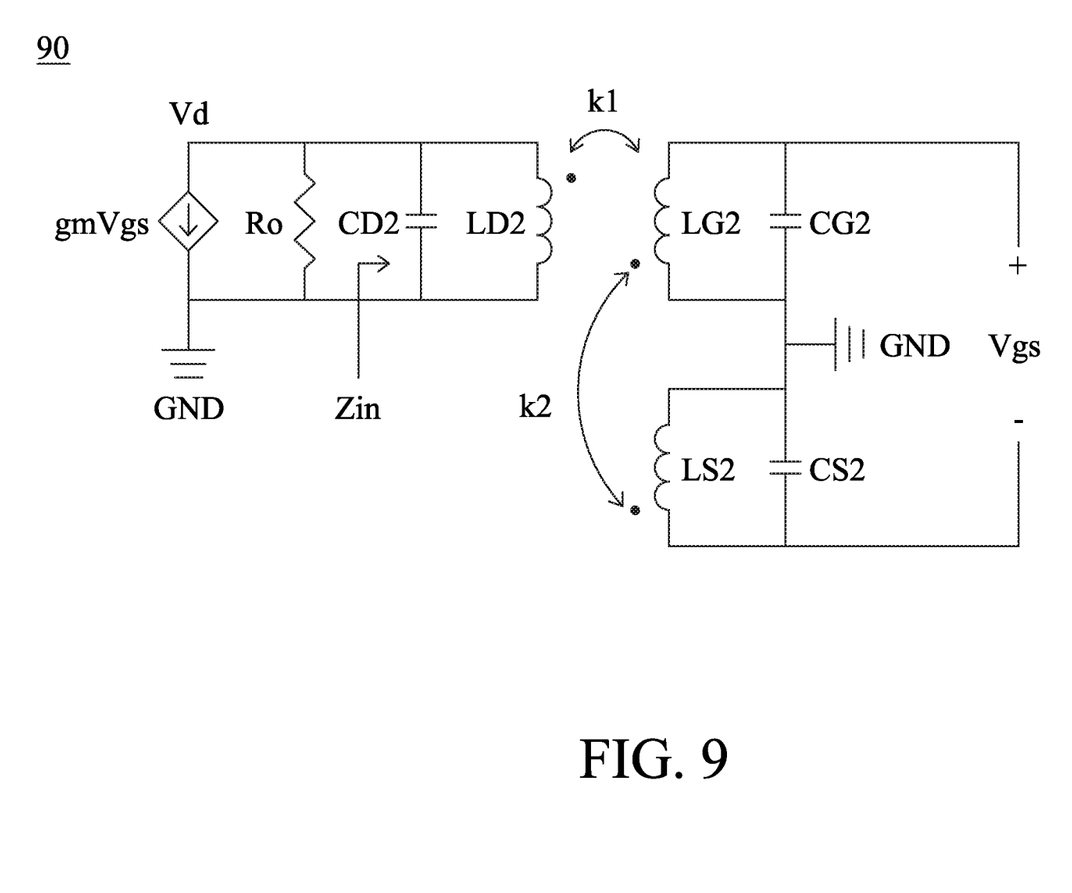
FIG. 9 is a circuit diagram of the half circuit, in a small-signal mode, shown in FIG. 8, in accordance with some embodiments of the present disclosure.

FIG. 9 is a circuit diagram of an equivalent circuit 90 in a small-signal mode of the half circuit 80 shown in FIG. 8, in accordance with some embodiments of the present disclosure. Referring also to FIG. 8, a dependent current source (labeled gmVgs in FIG. 9), is coupled between the source S1 and the drain D1 of the first transistor M1. However, for simplifying circuit analysis, referring back to FIG. 9, the dependent current source gmVgs is coupled between the drain D1 and the reference ground GND. Similarly, for simplifying circuit analysis, a parasitic resistor Ro is coupled between drain D1 and the reference ground GND.

To determine whether an oscillator is able to generate an oscillator signal, a Barkhausen Criterion is used. According to Barkhausen Criterion, a break point of a circuit is required. In the following analysis, the Vgs of the transistor M1 serves as a break point. The loop gain of the half circuit 80 in a small-signal mode can be expressed as follows.

$$\frac{Vout}{Vin} = gm(Ro // Zin(s)) \times (K1N1 + K2N2)$$

$$Zin(s) = \frac{S^3(LD1 \times LG1 \times CG1 \times LS1 \times CS1(1 - K1^2)) + SLD1}{S^4(LD1 \times LG1 \times CD1 \times CG1(1 - K1^2 K2^2)) + S^2(LD1 \times CD1 + LG1 \times CG1 + LS1 \times CS1) + 1}$$

Where Vin is the Vgs in the term (gmVgs), Vout is the Vgs between the capacitor CG1 and the capacitor CS1, Zin is an input resistance seen from the capacitor CD1, K1 is a coupling coefficient between the inductor LD1 and the inductor LG1, N1 is a turn ratio of the inductor LD1 to the inductor LG1, K2 is a coupling coefficient between the inductor LG and the inductor LS and N2 is a turn ratio of the inductor LG1 to the inductor LS1.

The first term gm(Ro//Zin(s)) of the loop gain is an active voltage gain of the loop gain of the oscillator 60, and is provided by the first transistor M1. The second term (K1N1+K2N2) is a passive voltage gain of the loop gain of the oscillator 60. Since, referring to FIG. 6, the first additional inductor L1 is coupled to the source S1 of the first transistor M1, a first portion (K2N2) of the passive voltage gain is provided. The first portion of the passive voltage gain includes a product of the first turn ration K2 and the first coupling efficient N2.

In other words, since a mutual inductance exists between the first additional inductor L1 of the voltage circuit 14 and the first inductor LG1, the first additional inductor L1 of the voltage circuit 14 and the first inductor LG1 provide a first portion of a passive voltage gain of the loop gain of the oscillator 60. The first portion of the passive voltage gain is derivative from the mutual inductance. Moreover, the first portion of the passive voltage gain includes a first turn ratio of the first additional inductor L1 to the first inductor LG1, and the first coupling efficient K2 of the first additional inductor L1 to the first inductor LG1. The loop gain of the oscillator 60 is a function of the first turn ratio N2 and the first coupling efficient K2. Similarly, the second inductor LD1 and the first inductor LS1 provides a second portion (K1N1) of the passive voltage gain. The second portion K1N1 of the passive voltage gain is derivative from the mutual inductance between the first inductor LS1 and the second inductor LD1. With the first additional inductor L1, the loop gain is enhanced. According to Barkhausen Criterion, the relatively high loop gain facilitates generating an oscillator signal.

Figure 10:
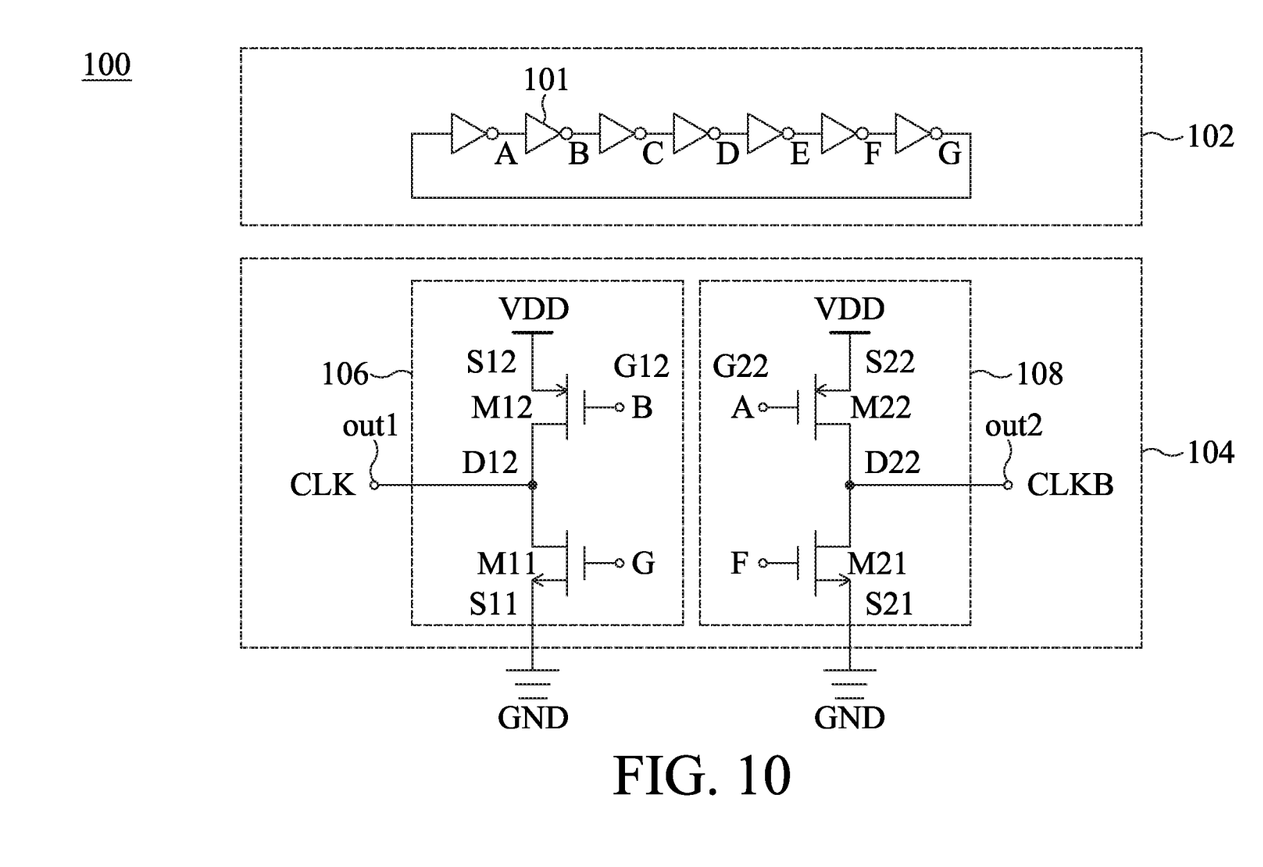
FIG. 10 is a circuit diagram of a clock generator, in accordance with some embodiments of the present disclosure.

FIG. 10 is a circuit diagram of a clock generator 100, in accordance with some embodiments of the present disclosure. Referring to FIG. 10, the clock generator 100 includes a ring oscillator 102 and a clock circuit 104 including a first circuit 106 and a second circuit 108.

The ring oscillator 102 includes a plurality of delay cells 101. In the present embodiment, there are seven delay cells 101 in the ring oscillator 102. However, the disclosure is not limited thereto. The ring oscillator 102 of the present disclosure includes, for example, three to seven such delay cells 101. Alternatively, the ring oscillator 102 may include more than seven delay cells 101. In an embodiment, the delay cell 101 includes an inverter.

The ring oscillator 102 functions to provide a first delay signal, a second delay signal, a third delay signal and a fourth delay signal. Each of the first to fourth delay signals has one of a first logic state and a second logic state. The first logic state, for example, a logically low state, is opposite to the second logic state, a logically high state. The first delay signal, for example, is output at an output B of the second delay cell 101. The second delay signal, for example, is output at an output G of the seventh delay cell 101. The third delay signal is output at an output A of the first delay cell 101. The fourth delay signal, for example, is output at an output F of the sixth delay cell 101. Waveforms of the delay signals are shown in FIG. 11.

The first circuit 106 includes a first transistor M12 and a second transistor M11. The first transistor M12 and the second transistor M11 are cascode connected between the supply voltage VDD and a reference ground GND. The first transistor M12 functions to pull up a voltage at an output out1 of the first circuit 106 toward the supply voltage VDD. A gate of the first transistor M12 is coupled to the output B, and therefore the first transistor M12 is operated in response to the first delay signal. The second transistor M11 functions to pull down the voltage at the output out1 of the first circuit 106 toward the reference ground GND. A gate of the second transistor M11 is coupled to the output G, and therefore the second transistor M11 operates in response to the second delay signal. The voltage CLK at the output out1 of the first circuit 106 serves as a first input signal of a voltage doubler.

The second circuit 108 includes a third transistor M22 and a fourth transistor M21. The third transistor M22 and the fourth transistor M21 are cascode connected between the supply voltage VDD and a reference ground GND. The third transistor M22 functions to pull up a voltage CLKB at an output out2 of the second circuit 108 toward the supply voltage VDD. A gate of the third transistor M22 is coupled to the third delay signal, and therefore the third transistor M22 operates in response to the third delay signal. The fourth transistor M21 functions to pull down the voltage CLKB at the output out2 of the second circuit 108 toward the reference ground GND. A gate of the fourth transistor M21 is coupled to the fourth delay signal, and therefore the fourth transistor M21 operates in response to the fourth delay signal. The voltage CLKB at the output out2 of the second circuit 108 serves as a second input signal of a voltage doubler. For being used by the voltage doubler, the voltage CLKB and the voltage CLK are not overlapped in active state (logically high).

Figure 11:
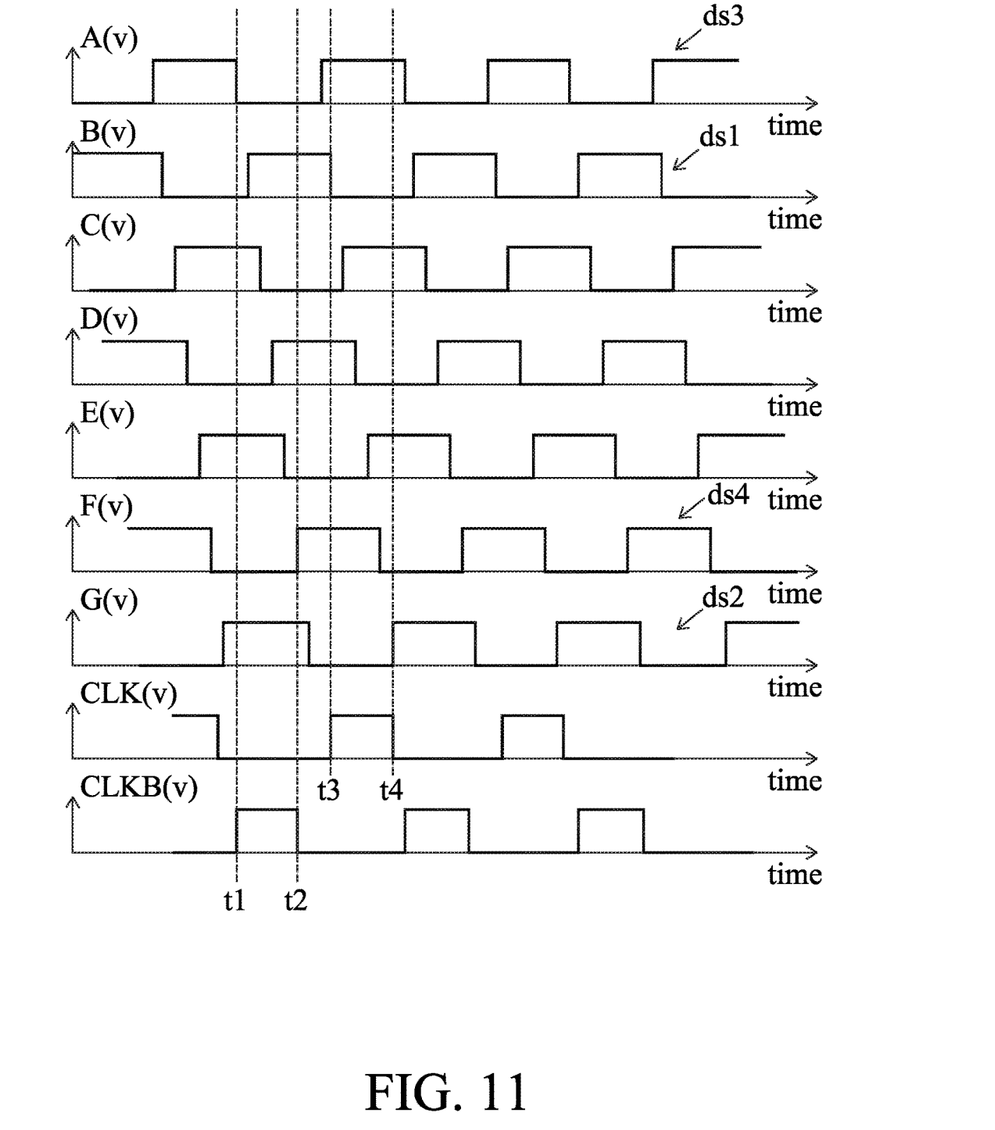
FIG. 11 illustrates waveforms generated by the clock generator shown in FIG. 10, in accordance with some embodiments of the present disclosure.

FIG. 11 illustrates waveforms generated by the clock generator shown in FIG. 10, in accordance with some embodiments of the present disclosure. A falling edge of the first delay signal ds1 occurs at a first timing t3, at which the second delay signal ds2 is logically low. A rising edge of the second delay signal ds2 occurs at a second timing t4, at which the first delay signal ds1 is logically low. Such first delay signal ds1 and second delay signal ds2 determine a rising edge and a falling edge of the voltage CLK. Moreover, a falling edge of the third delay signal ds3 occurs at a third timing t3, at which the fourth delay signal ds4 is logically low. A rising edge of the fourth delay signal ds4 occurs at a third timing t4, at which the third delay signal ds3 is logically low. Such third delay signal ds3 and fourth delay signal ds4 determines a rising edge and a falling edge of the voltage CLKB. As shown in FIG. 11, a first period between the first timing t3 and the second timing t4 staggers with a second period between the third timing t1 and the fourth timing t2. Therefore, the voltage CLK and the voltage CLKB are not overlapped, and therefore can be used by the voltage doubler.

In some existing circuits which provide two non-overlapped input signals to a voltage doubler, the existing circuits include a NOR gate. The NOR gate is a three stages casecode connected circuit. since the more number of stages exists, the high supply voltage is required, given a predetermined supply voltage VDD, the existing circuits are not able to work under a relatively low supply voltage. However, in the present disclosure, both the ring oscillator 102 and the clock circuit 104 include two stages casecode circuit. Therefore, the ring oscillator 102 and the clock circuit 104 can work normally under a relatively low supply voltage.

Some embodiments have one or a combination of the following features and/or advantages. In some embodiments, an oscillator includes an oscillator circuit and a voltage circuit. The oscillator circuit includes a first transistor. The voltage circuit is configured to, in a small signal mode, provide a voltage swing at a source of the first transistor, a gate-to-source voltage of the first transistor being associated with whether the oscillator is able to generate an oscillator signal.

In some embodiments, an oscillator includes an oscillator circuit and a voltage circuit. The oscillator circuit includes a first transistor configured to, in a small signal mode, provide an active voltage gain of an loop gain of the oscillator, and a first inductor configured to provide, in a small signal mode, a voltage swing at a gate of the first transistor. The voltage circuit is configured to, in a small signal mode, provide a voltage swing at a source of the first transistor, wherein a mutual inductance exists between the voltage circuit and the first inductor, and the voltage circuit and the first inductor provides a first portion of a passive voltage gain of the loop gain of the oscillator; the first portion of the passive voltage gain being derivative from the mutual inductance.

In some embodiments, a clock generator includes a ring oscillator and a signal generation circuit. The ring oscillator is configured to provide a first delay signal, a second delay signal, a third delay signal and a fourth delay signal, each of them including a first logic state and a second logic state, wherein a falling edge of the first delay signal and the first logic state of the second delay signal occurs at a first timing, and the first logic state of the first delay signal and a rising edge of the second delay signal occurs at a second timing, wherein a falling edge of the third delay signal and the first logic state of the third delay signal occurs at a third timing, and the first logic state of the third delay signal and a rising edge of the fourth delay signal occurs at a third timing, wherein a first period between the first timing and the second timing staggers with a second period between the third timing and the fourth timing. The signal generation circuit includes a first circuit and a second circuit. The first circuit includes a first transistor configured to pull up a voltage at an output of the first circuit toward a supply voltage, and to be operated in response to the first delay signal; and a second transistor configured to pull down the voltage at the output of the first circuit toward a reference ground, and to be operated in response to the second delay signal. The second circuit includes a third transistor configured to pull up a voltage at an output of the second circuit toward the supply voltage, and to be operated in response to the third delay signal; and a fourth transistor configured to pull down the voltage at the output of the second circuit toward a reference ground, and to be operated in response to the fourth delay signal. The voltage at the output of the first circuit and the voltage at the output of the second circuit serve as input signals of a voltage doubler.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An oscillator comprising:
a first transistor;
an oscillator circuit including a first inductor coupled to a bias voltage and operatively connected to provide, in a small signal mode, a first voltage swing at a gate of the first transistor, and a second inductor coupled to a supply voltage and operatively connected to provide, in a small signal mode, a second voltage swing at a drain of the first transistor, the first inductor and the second inductor being operatively connected to have a first mutual inductance with each other; and
a voltage circuit configured to, in a small signal mode, provide a third voltage swing at a source of the first transistor, wherein a gate-to-source voltage of the first transistor is in response to the oscillator circuit generating an oscillator signal, wherein the voltage circuit includes a first inductive device configured to provide the voltage swing at the source of the first transistor, and to have a second mutual inductance between the first inductor and the first inductive device.

2. The oscillator of claim 1, wherein a phase of the voltage swing provided by the voltage circuit at the source of the first transistor is opposite to that at a gate of the first transistor.

3. The oscillator of claim 1, wherein the oscillator circuit further includes a second transistor, a voltage at the source of the first transistor being substantially opposite to that at the source of the second transistor, a voltage at a drain of the first transistor being substantially opposite to that at a drain of the second transistor, and a voltage at a gate of the first transistor being substantially opposite to that at a gate of the second transistor.

4. The oscillator of claim 1, wherein the first inductor in polarity is opposite to the first inductive device.

5. The oscillator of claim 4, wherein the first inductive device includes a first additional inductor coupled between the source of the first transistor and a reference ground.

6. The oscillator of claim 1, further comprising:
a frequency adjustment circuit configured to, in response to a signal, adjust a capacitance present at the source of the first transistor from a first capacitance to a second capacitance, wherein the capacitance is in response to a frequency of the oscillator signal.

7. The oscillator of claim 6, wherein the frequency adjustment circuit includes a first capacitor, a second capacitor and a first switch coupled in series, the coupled first capacitor, second capacitor and first switch are coupled between the source of the first transistor and the source of the second transistor.

8. The oscillator of claim 7, wherein the first capacitance includes a capacitance of the first capacitor.

9. The oscillator of claim 6, wherein the frequency circuit adjustment is configured to adjust the frequency by a first scale by adjusting the capacitance present at the source of the first transistor, the oscillator circuit further comprising:
a first local circuit configured to adjust the frequency by a second scale by adjusting a capacitance present at a gate of the first transistor, wherein the second scale is larger than the first scale.

10. An oscillator, comprising:
an oscillator circuit including:
a first transistor configured to, in a small signal mode, provide an active voltage gain of a loop gain of the oscillator,
a first inductor configured to provide, in a small signal mode, a first voltage swing at a gate of the first transistor, and
a second inductor coupled to a supply voltage and operatively connected to provide, in a small signal mode, a second voltage swing at a drain of the first transistor, the first inductor and the second inductor being operatively connected to have a first mutual inductance with each other; and
a voltage circuit configured to, in a small signal mode, provide a third voltage swing at a source of the first transistor, wherein a mutual inductance exists between the voltage circuit and the first inductor, and the voltage circuit and the first inductor provides a first portion of a passive voltage gain of the loop gain of the oscillator; the first portion of the passive voltage gain being derivative from the mutual inductance, wherein the voltage circuit includes a first inductive device configured to provide the voltage swing at the source of the first transistor, and to have a second mutual inductance between the first inductor and the first inductive device.

11. The oscillator of claim 10, wherein the first inductive device includes a first additional inductor, the first portion of the passive voltage gain including a first turn ratio of the first additional inductor to the first inductor, and a first coupling efficient of the first additional inductor to the first inductor.

12. The oscillator of claim 11, wherein the loop gain of the oscillator is a function of the first turn ratio and the first coupling efficient.

13. The oscillator of claim 12, wherein the first portion of the passive voltage gain includes a product of the first turn ration and the first coupling efficient.

14. The oscillator of claim 11, wherein the second inductor and the first inductor provide a second portion of the passive voltage gain, the second portion of the passive voltage gain being derivative from the mutual inductance between first inductor and the second inductor.

15. The oscillator of claim 10, wherein a phase of the voltage swing provided by the voltage circuit at the source of the first transistor is opposite to that at the gate of the first transistor.

16. The oscillator of claim 10, wherein the voltage circuit includes a first inductive device including a first additional inductor, the first additional inductor and the first inductor configured to provide an impedance present at the source of the first transistor in a third harmonic frequency of the voltage swing at the source of the first transistor.

17. The oscillator of claim 10, further comprising:
a frequency adjustment circuit configured to, in response to a signal, adjust a capacitance present at the source of the first transistor from a first capacitance to a second capacitance, wherein the capacitance is in response to a frequency of the oscillator signal.

18. The oscillator of claim 17, wherein the frequency adjustment circuit includes a first capacitor, a second capacitor and a first switch coupled in series, the coupled first capacitor, second capacitor and first switch are coupled between the source of the first transistor and the source of the second transistor.

19. An oscillator, comprising:
a transistor;
an oscillator circuit including a first inductor coupled to a bias voltage and operatively connected to provide, in a small signal mode, a first voltage swing at a gate of the first transistor, and a second inductor coupled to a supply voltage and operatively connected to provide, in a small signal mode, a second voltage swing at a drain of the first transistor, the first inductor and the second inductor being operatively connected to have a first mutual inductance with each other, wherein an oscillation signal generated by the oscillator circuit is generated at a gate of the transistor, and in a small signal mode, a voltage at a source of the transistor is free of being zero;
an additional inductor coupled between the source of the transistor and a reference ground; and
an inductor coupled between a bias voltage and the gate of the transistor, wherein a second mutual inductance is formed between the inductor and the additional inductor.

* * * * *